(12) United States Patent
Gu et al.

(10) Patent No.: US 10,192,791 B1
(45) Date of Patent: Jan. 29, 2019

(54) SEMICONDUCTOR DEVICES WITH ROBUST LOW-K SIDEWALL SPACERS AND METHOD FOR PRODUCING THE SAME

(71) Applicant: GLOBALFOUNDRIES Inc., Grand Cayman (KY)

(72) Inventors: Man Gu, Malta, NY (US); Tao Han, Clifton Park, NY (US); Junsic Hong, Malta, NY (US); Jiehui Shu, Clifton Park, NY (US); Asli Sirman, Malta, NY (US); Charlotte Adams, Schenectady, NY (US); Jinping Liu, Ballston Lake, NY (US); Keith Tabakman, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/913,547

(22) Filed: Mar. 6, 2018

(51) Int. Cl.
 *H01L 21/8242* (2006.01)
 *H01L 21/8238* (2006.01)
 *H01L 21/3105* (2006.01)
 *H01L 21/02* (2006.01)
 *H01L 29/51* (2006.01)
 *H01L 27/092* (2006.01)

(52) U.S. Cl.
 CPC .. *H01L 21/823864* (2013.01); *H01L 21/0234* (2013.01); *H01L 21/3105* (2013.01); *H01L 27/092* (2013.01); *H01L 29/51* (2013.01)

(58) Field of Classification Search
 CPC ......... H01L 21/823864; H01L 21/0234; H01L 21/3105; H01L 27/092; H01L 29/51
 See application file for complete search history.

(56) References Cited

U.S. PATENT DOCUMENTS

| 6,204,136 | B1 | 3/2001 | Chan et al. |
| 6,465,349 | B1 | 10/2002 | Ngo et al. |
| 7,084,449 | B2 * | 8/2006 | Cheng ............... H01L 27/10894 257/301 |
| 7,951,666 | B2 * | 5/2011 | Ho ........................ H01L 29/945 257/296 |
| 9,245,793 | B2 | 1/2016 | Limdulpaiboon et al. |
| 2015/0179509 | A1 | 6/2015 | Limdulpaiboon et al. |

* cited by examiner

*Primary Examiner* — Julio J Maldonado
*Assistant Examiner* — Andre' C Stevenson
(74) *Attorney, Agent, or Firm* — Ditthavong & Steiner P.C.

(57) ABSTRACT

A method of forming a robust low-k sidewall spacer by exposing an upper portion of the spacer to a thermal and plasma treatment prior to downstream processes and resulting device are provided. Embodiments include providing a pair of gates separated by a canyon trench over a substrate, an EPI layer in a bottom of the canyon trench, respectively, and a low-k spacer on each opposing sidewall of the pair; forming a masking layer in a bottom portion of the canyon trench, an upper portion of the low-k spacers exposed; and treating the upper portion of the low-k spacers with a thermal and plasma treatment.

20 Claims, 5 Drawing Sheets

SEMICONDUCTOR DEVICES WITH ROBUST LOW-K SIDEWALL SPACERS AND METHOD FOR PRODUCING THE SAME

TECHNICAL FIELD

The present disclosure relates to semiconductor devices, such as integrated circuits (ICs), and to a method of manufacturing them. The present disclosure is particularly applicable to ICs with low-k spacers, particularly for the 7 nanometer (nm) technology node and beyond.

BACKGROUND

The development and integration of low-k materials for sidewall spacers has proven challenging, primarily due to their weakness, particularly resulting from downstream processing, e.g., etching, ashing, and/or cleaning. Conventional practices include the use of a robust film such as oxide, silicon nitride (SiN), silicon carbon nitride (SiCN), etc. as a crust layer to protect the weaker low-k materials during the downstream processes. Such techniques are effective to reduce lateral erosion of the low-k materials, but provide minimal protection to spacer shoulder loss. These conventional approaches also result in unwanted epitaxial (EPI) growth, trench silicide-gate (TS-PC) short, and gate height variations. Further, such approaches prevent implementation of materials with lower dielectric constant (k) values to further boost device performance.

A need therefore exists for methodology enabling formation of a robust low-k sidewall spacer for downstream processes and the resulting device.

SUMMARY

An aspect of the present disclosure is a method of forming a robust low-k sidewall spacer by exposing an upper portion of the spacer to a thermal and plasma treatment prior to downstream processes.

Another aspect of the present disclosure is a device with a thermal and plasma treated robust low-k sidewall spacer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a pair of gates separated by a canyon trench over a substrate, an EPI layer in a bottom of the canyon trench, respectively, and a low-k spacer on each opposing sidewall of the pair; forming a masking layer in a bottom portion of the canyon trench, an upper portion of the low-k spacers exposed; and treating the upper portion of the low-k spacers with a thermal and plasma treatment.

Aspects of the present disclosure include providing a pair of p-type field-effect transistor (PFET) gates and a pair of n-type field-effect transistor (NFET) gates over the substrate. Further aspects include forming the masking layer in the bottom portion of the canyon trench until the upper portion has a height of 60 nm to 80 nm. Another aspect includes forming the masking layer of a spin-on-hardmask (SOH). Further aspects include forming the SOH of carbon/hydrogen/oxygen (C/H/O). Additional aspects include treating the upper portion with a DPN treatment. Another aspect includes treating the upper portion with the DPN treatment at a temperature of 400° C. to 500° C. for 20 seconds to 40 seconds.

Another aspect of the present disclosure is a device including: a gate dielectric layer, laterally separated, over a substrate; a pair of gates over the gate dielectric layer, respectively; a low-k sidewall spacer along each opposing sidewall of the pair, the low-k sidewall spacer having a thermal and plasma treated upper portion; an EPI layer between the low-k sidewall spacers; and a capping layer over each gate of the pair.

Aspects of the device include each gate of the pair which includes polysilicon (poly), amorphous carbon (a-C), or silicon germanium (SiGe). Another aspect includes the gate dielectric layer which includes silicon oxide (SiO) and the capping layer which includes SiN, silicon dioxide ($SiO_2$), titanium dioxide ($TiO_2$), titanium nitride (TiN), or aluminum oxide ($Al_2O_3$), and wherein an upper surface of the capping layer and an upper surface of the low-k spacer are coplanar. Other aspects include a pair of PFET gates over the gate dielectric layer, respectively; and a pair of NFET gates over a second gate dielectric layer, laterally separated, over the substrate. A further aspect includes the EPI layer between the low-k sidewall spacers of the PFET gates which include silicon germanium doped with boron (SiGe:B) and the EPI layer between the low-k sidewall spacers of the NFET gates which includes silicon containing phosphorus (Si:P). Additional aspects include the low-k sidewall spacer which includes silicon-oxygen-carbon-nitride (SiOCN), silicon oxycarbide (SiCO), or silicon borocarbonitride (SiBCN). A further aspect includes each low-k sidewall spacer having a width of 6 nm to 7 nm. Additional aspects include the upper portion of each low-k sidewall spacer having a height of 60 nm to 80 nm.

A further aspect of the present disclosure is a method including: providing a pair of PFET gates and a pair of NFET gates each separated by a canyon trench over a Si substrate, a first EPI layer and a second EPI layer in a bottom of the canyon trench, respectively, and a low-k spacer on each opposing sidewall of the pair of PFET gates and the pair of NFET gates; forming a SOH in a bottom portion of the canyon trench, an upper portion of the low-k spacers exposed; and treating the upper portion with a DPN treatment.

Aspects of the present disclosure include forming the SOH in the bottom portion of the canyon trench until the upper portion has a height of 60 nm to 80 nm. Another aspect includes forming the SOH of C/H/O. A further aspect includes treating the upper portion with the DPN treatment at a temperature of 400° C. to 500° C. for 20 seconds to 40 seconds. Another aspect includes the DPN treatment which further includes: delivering a power level of 400 watts to 2000 watts to a reaction chamber to generate a nitrogen (N) plasma, wherein the N plasma is introduced into the reaction chamber at a flow of 50 standard cubic centimeters per minute (SCCM) to 300 SCCM to establish a pressure of 10 millitorr (mTorr) to 200 mTorr.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of spacer shoulder loss attendant upon downstream processes on low-k sidewall spacers. The problem is solved, inter alia, by introducing a DPN treatment on an upper/shoulder portion of a low-k sidewall spacer prior to downstream processes.

Methodology in accordance with embodiments of the present disclosure providing a pair of gates separated by a canyon trench over a substrate, an EPI layer in a bottom of the canyon trench, respectively, and a low-k spacer on each opposing sidewall of the pair. A masking layer is formed in a bottom portion of the canyon trench, an upper portion of the low-k spacers exposed; and the upper portion of the low-k spacers is treated with a thermal and plasma treatment.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
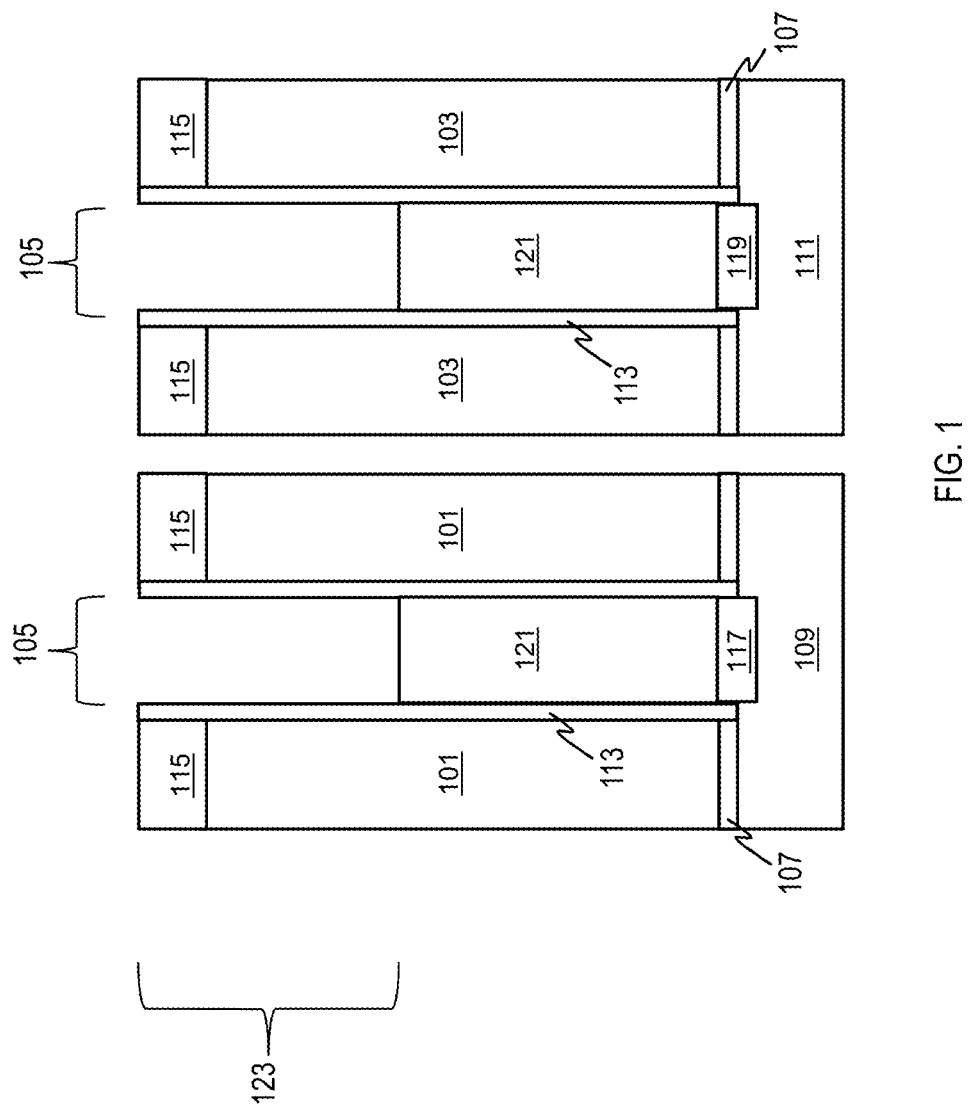
FIGS. 1 through 5 schematically illustrate cross-sectional views of a process flow for forming a robust low-k sidewall spacer by exposing an upper/shoulder portion of the sidewall spacer to a thermal and plasma treatment prior to downstream processes, in accordance with an exemplary embodiment.

FIGS. 1 through 5 schematically illustrate cross-sectional views of a process flow for forming a robust low-k sidewall spacer by exposing an upper/shoulder portion of the sidewall spacer to a thermal and plasma treatment prior to downstream processes, in accordance with an exemplary embodiment. Referring to FIG. 1, a pair of PFET gates 101 and a pair of NFET gates 103, each separated by a canyon trench or space 105, are provided over a dielectric gate layer 107, e.g., formed of SiO. In one instance, the dielectric gate layer 107 may be formed over fins, fully depleted silicon-on-insulator (FDSOI) devices, planar partially depleted silicon on insulator (PDSOI) device or the like devices. In this instance, the dielectric gate layer 107 is formed over silicon (Si) fins 109 and 111 laterally separated on a Si substrate (not shown for illustrative convenience), respectively, subsequent to a known replacement gate (RG) hard mask (HM) stripping process. The PFET gates 101 and the NFET gates 103 may be formed, e.g., of poly, a-C, or SiGe and include low-k sidewall spacers 113, e.g., formed of SiOCN, SiCO, SiBCN, and a capping layer 115, e.g., formed of SiN, $SiO_2$, $TiO_2$, TiN, or $Al_2O_3$, wherein an upper surface of the low-k sidewall spacers 113 and an upper surface of the capping layer 115 are coplanar. In this instance, the low-k sidewall spacers 113 are formed, e.g., with a width of 6 nm to 7 nm, by ALD. Further, the PFET gates 101 and the NFET gates 103 include an EPI layer 117, e.g., formed of SiGe:B, and an EPI layer 119, e.g., formed of Si:P, respectively. In this instance, the SiGe:B EPI layer 117 has a thickness, e.g., of 50 nm to 60 nm, and the Si:P EPI layer 119 has a thickness, e.g., of 40 nm to 50 nm. Subsequently, a masking layer 121 is formed, e.g., of a SOH, Spin-on Carbon (SOC), in the canyon trenches 105 between the PFET gates 101 and the NFET gates 103 such that 60 nm to 80 nm of each low-k sidewall spacer 113 remains exposed. The exposed portion of the low-k sidewall spacers 113 is hereinafter referred to as the upper/shoulder portion 123. In this instance, the SOH layer 121 may be formed, e.g., of C/H/O with a high percentage of C, or a combination of similar materials, by a coating process.

Figure 2:
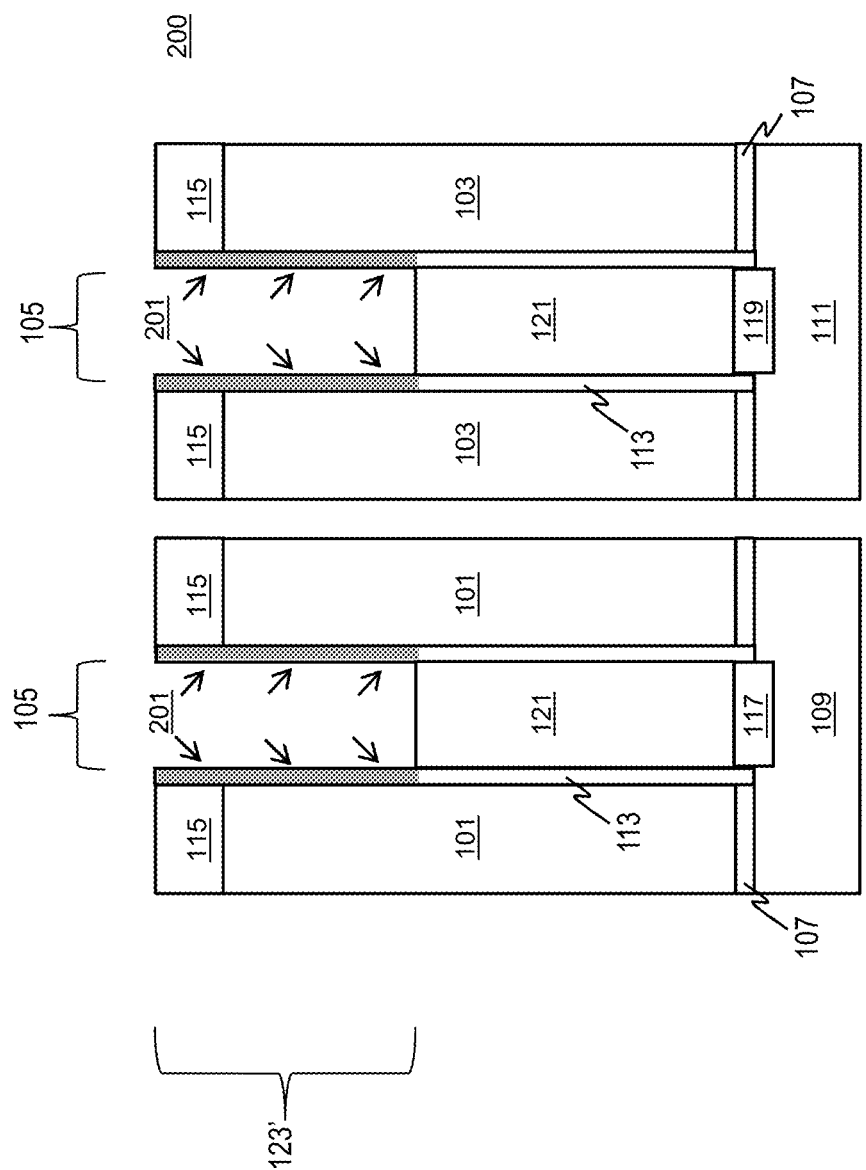
Figure 3:
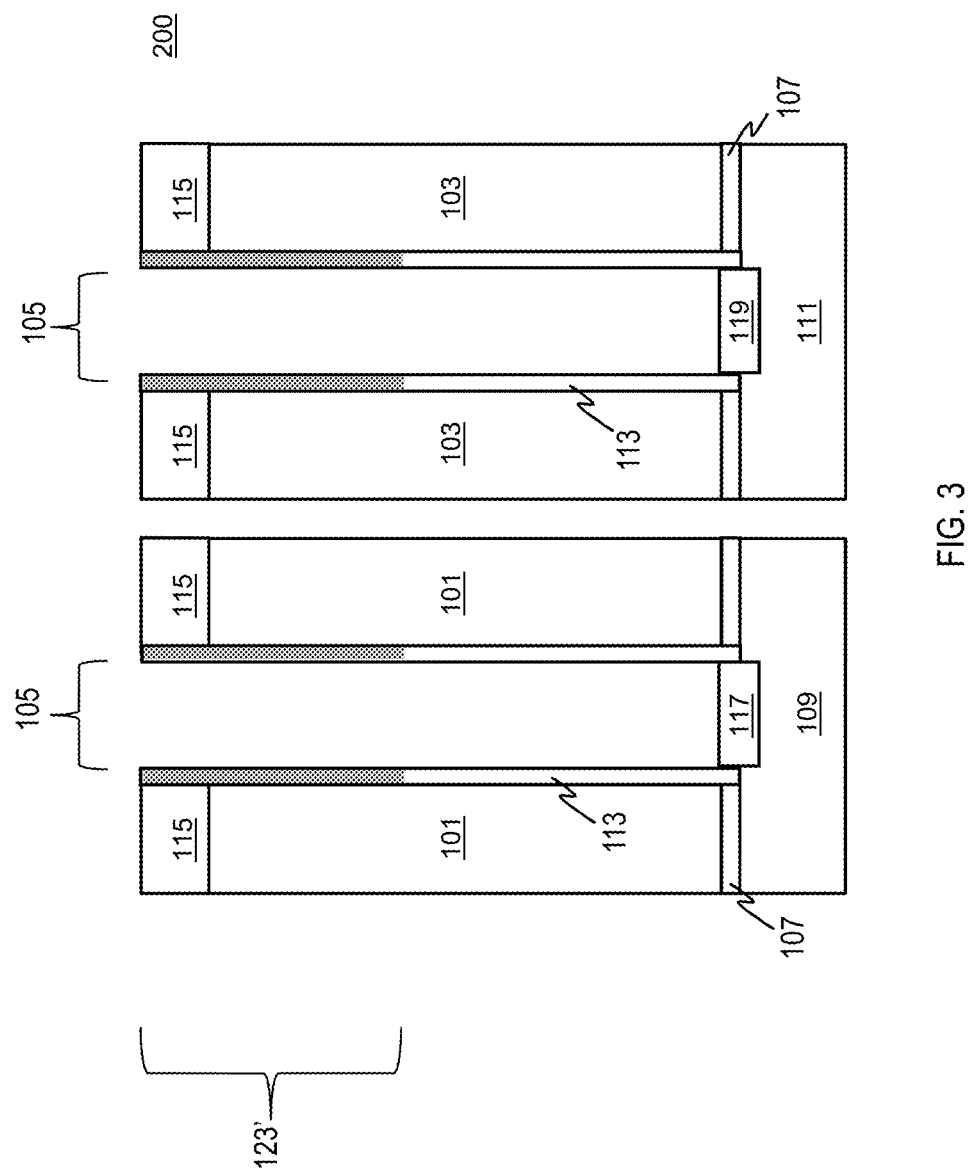

Referring to FIG. 2, a thermal and plasma treatment is introduced to the upper/shoulder portion 123 of the low-k sidewall spacers 113, as depicted by the arrows 201, forming the upper/shoulder portion 123' (as depicted by the shading). In one instance, the thermal and plasma treatment may be a DPN treatment, a remote plasma nitridation (RPN) treatment, an inductively coupled plasma (ICP) and ICP source treatment, a nitrogen (N) implantation process or any other similar thermal and plasma processes. In this instance, the upper/shoulder portion 123 of the low-k sidewall spacers 113 is selectively treated by DPN at a temperature of 400° C. to 500° C. for 20 seconds to 40 seconds. Specifically, this process involves placing the device 200 in a reaction chamber (not shown for illustrative convenience). Then, the upper/shoulder portion 123 is introduced to N plasma generated by delivering a power level of 400 watts to 2000 watts to the reaction chamber. A flow of N plasma is introduced into the reaction chamber at a flow rate of 50 sccm to 300 sccm, and the N plasma maintained at a pressure of 10 mTorr to 200 mTorr in the reaction chamber. Referring to FIG. 3, the device 200 is then removed from the reaction chamber and the SOH layer 121 is removed, e.g., by ashing and wet stripping.

Figure 4:
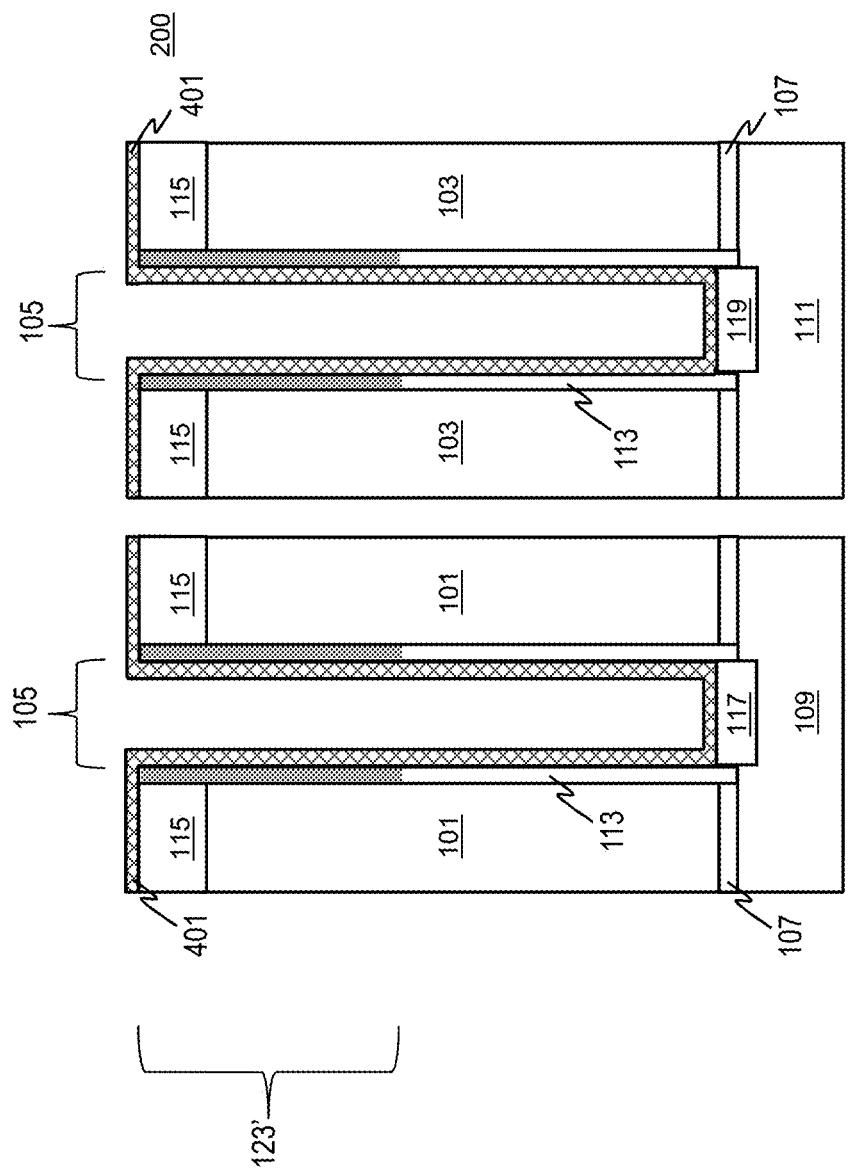
Figure 5:
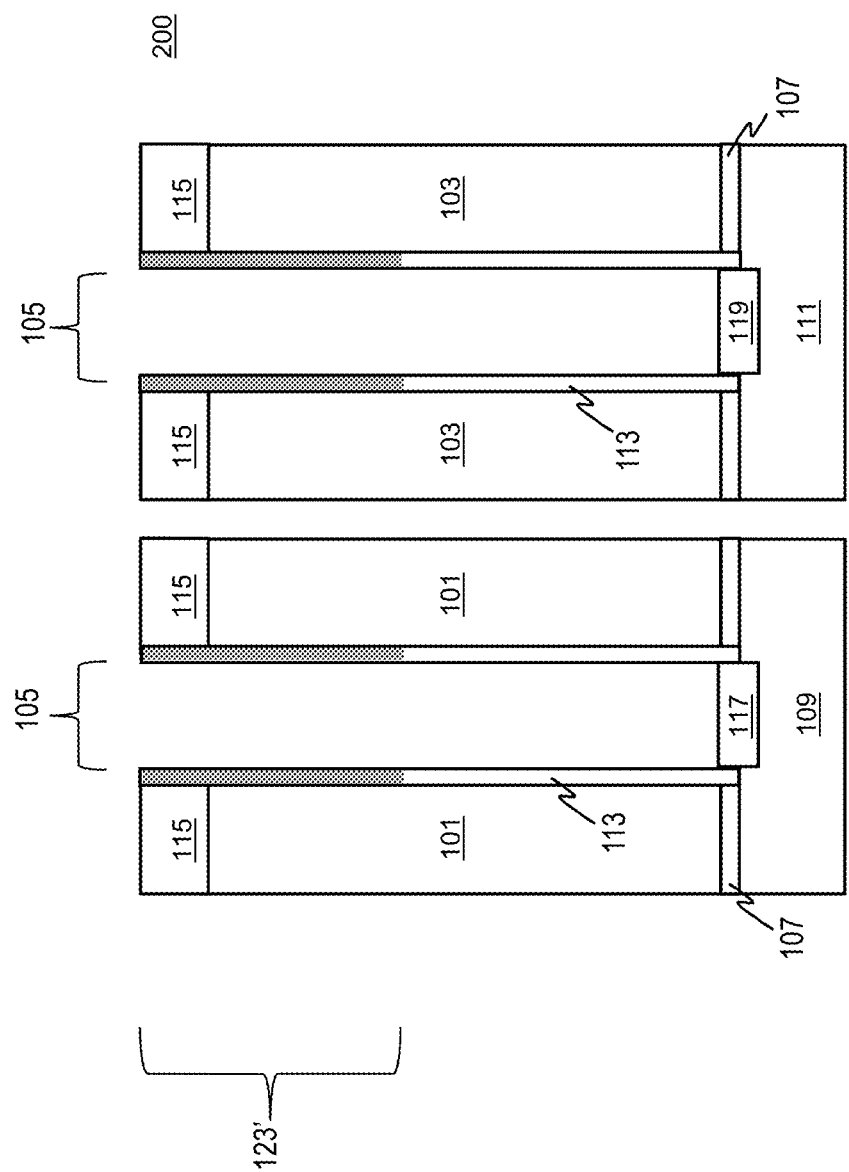

Referring to FIG. 4, a protective layer 401 is formed, e.g., of oxide or the like materials, over the low-k sidewall spacers 113 having a robust upper/shoulder portion 123'. Thereafter, known source/drain implantation steps (BN/PP/BP) are performed in connection with the PFET gates 101, e.g., a boron implant, and the NFET gates 103, e.g., a carbon/arsenic/phosphorous implant. Subsequently, the protective layer 401 is removed, as depicted in FIG. 5. In this instance, the stripping of the protective layer 401 neither damages the low-k sidewall spacers 113 nor causes shoulder loss due to the robust upper/shoulder portion 123', therefore, the low-k sidewall spacers 113 remain intact prior to downstream processes.

The embodiments of the present disclosure can achieve several technical effects, such as significantly strengthening the shoulder profile of low-k sidewall spacers prior to downstream processes; improving downstream variability control, e.g., spacer profile, gate height, replacement metal gate (RMG) chamfer/recess and trench silicide (TS) landing; and improving yield, e.g., spacer erosion, and TS-PC short. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of FinFETs, PDSOI, FDSOI or any of the highly integrated semiconductor devices including low-k sidewall spacers, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a pair of gates separated by a canyon trench over a substrate, an epitaxial (EPI) layer in a bottom of the canyon trench, respectively, and a low-k spacer on each opposing sidewall of the pair;
   forming a masking layer in a bottom portion of the canyon trench, an upper portion of the low-k spacers exposed; and
   treating the upper portion of the low-k spacers with a thermal and plasma treatment.

2. The method according to claim 1, further comprising providing a pair of p-type field-effect transistor (PFET) gates and a pair of n-type field-effect transistor (NFET) gates over the substrate.

3. The method according to claim 1, comprising forming the masking layer in the bottom portion of the canyon trench until the upper portion has a height of 60 nanometer (nm) to 80 nm.

4. The method according to claim 1, comprising forming the masking layer of a spin-on-hardmask (SOH).

5. The method according to claim 4, comprising forming the SOH of carbon/hydrogen/oxygen (C/H/O).

6. The method according to claim 1, comprising treating the upper portion with a decoupled plasma nitridation (DPN) treatment.

7. The method according to claim 6, comprising treating the upper portion with the DPN treatment at a temperature of 400° C. to 500° C. for 20 seconds to 40 seconds.

8. A device comprising:
   a gate dielectric layer, laterally separated, over a substrate;
   a pair of gates over the gate dielectric layer, respectively;
   a low-k sidewall spacer along each opposing sidewall of the pair, the low-k sidewall spacer having a thermal and plasma treated upper portion;
   an epitaxial (EPI) layer between the low-k sidewall spacers; and
   a capping layer over each gate of the pair.

9. The device according to claim 8, wherein each gate of the pair comprises polysilicon (poly), amorphous carbon (a-C), or silicon germanium (SiGe).

10. The device according to claim 8, wherein the gate dielectric layer comprises silicon oxide (SiO) and the capping layer comprises silicon nitride (SiN), silicon dioxide ($SiO_2$), titanium dioxide ($TiO_2$), titanium nitride (TiN), or aluminum oxide ($Al_2O_3$), and wherein an upper surface of the capping layer and an upper surface of the low-k spacer are coplanar.

11. The device according to claim 8, further comprising:
    a pair of p-type field-effect transistor (PFET) gates over the gate dielectric layer, respectively; and
    a pair of n-type field-effect transistor (NFET) gates over a second gate dielectric layer, laterally separated, over the substrate.

12. The device according to claim 11, wherein the EPI layer between the low-k sidewall spacers of the PFET gates comprises silicon germanium doped with boron (SiGe:B) and the EPI layer between the low-k sidewall spacers of the NFET gates comprises silicon containing phosphorus (Si:P).

13. The device according to claim 8, wherein the low-k sidewall spacer comprises silicon-oxygen-carbon-nitride (SiOCN), silicon oxycarbide (SiCO), or silicon borocarbonitride (SiBCN).

14. The device according to claim 8, wherein each low-k sidewall spacer has a width of 6 nanometer (nm) to 7 nm.

15. The device according to claim 11, wherein the upper portion of each low-k sidewall spacer comprises a height of 60 nm to 80 nm.

16. A method comprising:
    providing a pair of p-type field-effect transistor (PFET) gates and a pair of n-type field-effect transistor (NFET) gates each separated by a canyon trench over a Si substrate, a first epitaxial (EPI) layer and a second EPI layer in a bottom of the canyon trench, respectively, and a low-k spacer on each opposing sidewall of the pair of PFET gates and the pair of NFET gates;
    forming a spin-on-hardmask (SOH) in a bottom portion of the canyon trench, an upper portion of the low-k spacers exposed; and
    treating the upper portion with a decoupled plasma nitridation (DPN) treatment.

17. The device according to claim 16, comprising forming the SOH in the bottom portion of the canyon trench until the upper portion has a height of 60 nanometer (nm) to 80 nm.

18. The method according to claim 16, comprising forming the SOH of carbon/hydrogen/oxygen (C/H/O).

19. The method according to claim 16, comprising treating the upper portion with the DPN treatment at a temperature of 400° C. to 500° C. for 20 seconds to 40 seconds.

20. The method according to claim 16, wherein the DPN treatment further comprises:
    delivering a power level of 400 watts to 2000 watts to a reaction chamber to generate a nitrogen (N) plasma, wherein the N plasma is introduced into the reaction chamber at a flow of 50 standard cubic centimeters per minute (SCCM) to 300 SCCM to establish a pressure of 10 millitorr (mTorr) to 200 mTorr.

* * * * *